(12) United States Patent
Liu et al.

(10) Patent No.: US 7,776,658 B2
(45) Date of Patent: Aug. 17, 2010

(54) COMPACT CO-PACKAGED SEMICONDUCTOR DIES WITH ELEVATION-ADAPTIVE INTERCONNECTION PLATES

(75) Inventors: Kai Liu, Mountain View, CA (US); Ming Sun, Sunnyvale, CA (US)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 92 days.

(21) Appl. No.: 12/188,160

(22) Filed: Aug. 7, 2008

(65) Prior Publication Data

US 2010/0032819 A1    Feb. 11, 2010

(51) Int. Cl.
*H01L 21/50* (2006.01)
*H01L 21/48* (2006.01)
*H01L 21/44* (2006.01)
*H01L 23/495* (2006.01)
*H01L 23/34* (2006.01)
*H01L 23/498* (2006.01)

(52) U.S. Cl. .................. 438/121; 438/123; 257/676; 257/666; 257/502; 257/723; 257/E23.037; 257/E23.043; 257/E23.061

(58) Field of Classification Search ............. 438/121, 438/123; 257/676, 666, 502, 723, E23.037, 257/E23.043, E23.061
See application file for complete search history.

(56) References Cited

U.S. PATENT DOCUMENTS 6,465,875 B2 * 10/2002 Connah et al. .............. 257/666
6,919,644 B2 *  7/2005 Uchida ...................... 257/784

\* cited by examiner

*Primary Examiner*—Luan C Thai
(74) *Attorney, Agent, or Firm*—Chein-Hwa Tsao; Chemily LLC

(57) ABSTRACT

A semiconductor package is disclosed for packaging two adjacent semiconductor dies atop a circuit substrate. The dies are separated from each other along their longitudinal edges with an inter-die distance. An elevation-adaptive electrical connection connects a top metalized contact of die two to the bottom surface of die one while accommodating for elevation difference between the surfaces. The elevation-adaptive electrical connection includes:
  a) An L-shaped circuit route that is part of the circuit substrate, extending transversely from a die one longitudinal edge and placing an intermediate contact area next to a die two transverse edge.
  b) An interconnection plate connecting the top metalized contact area of die two with the intermediate contact area while being formed to accommodate for elevation difference between the contact areas.

Consequently, the semiconductor package reduces the inter-die distance from an otherwise direct transverse circuit routing between the longitudinal edges of the dies.

16 Claims, 11 Drawing Sheets

Fig. 1 Connected High-Side & Low-Side MOSFET

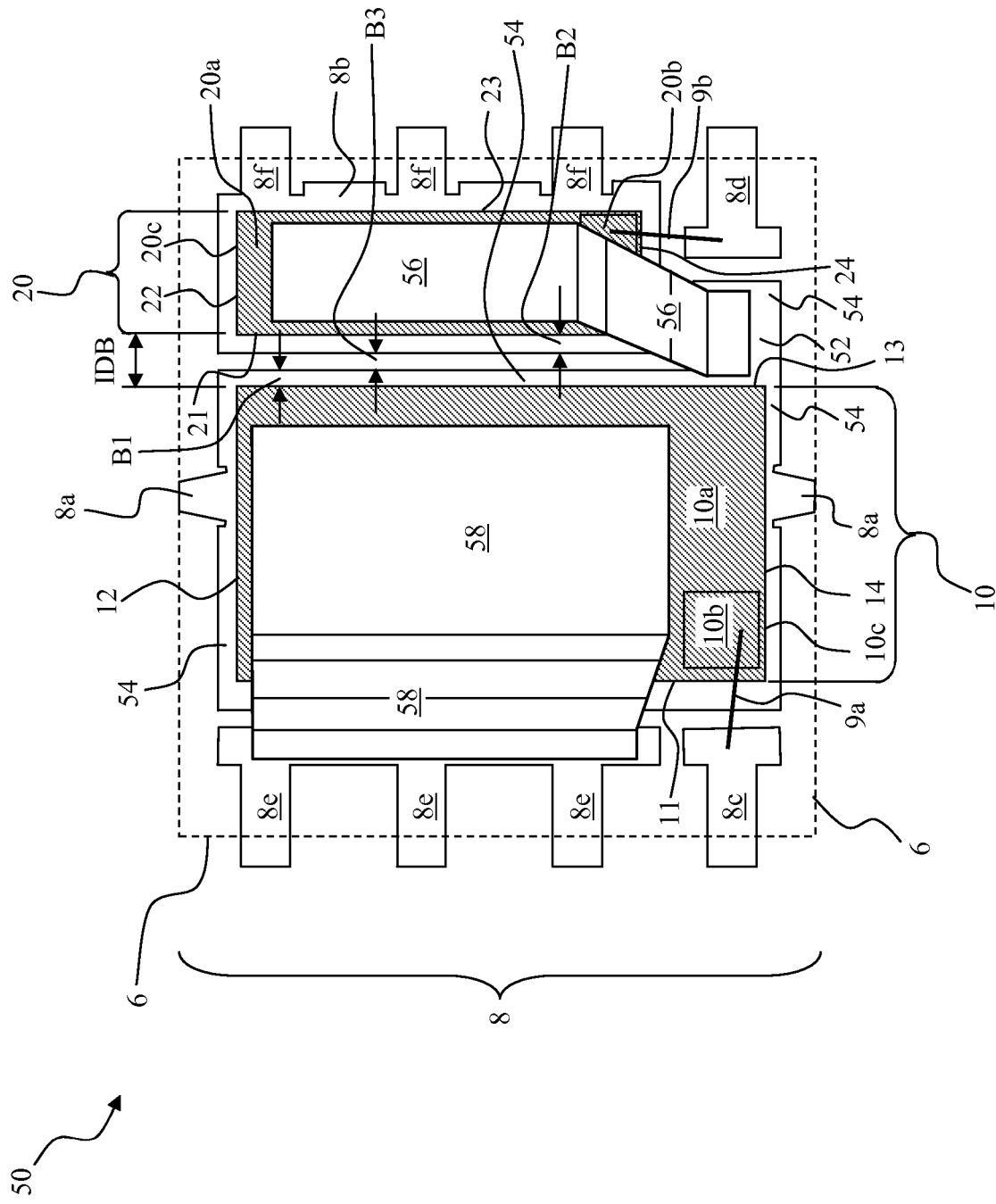
Fig. 3A Present Invention

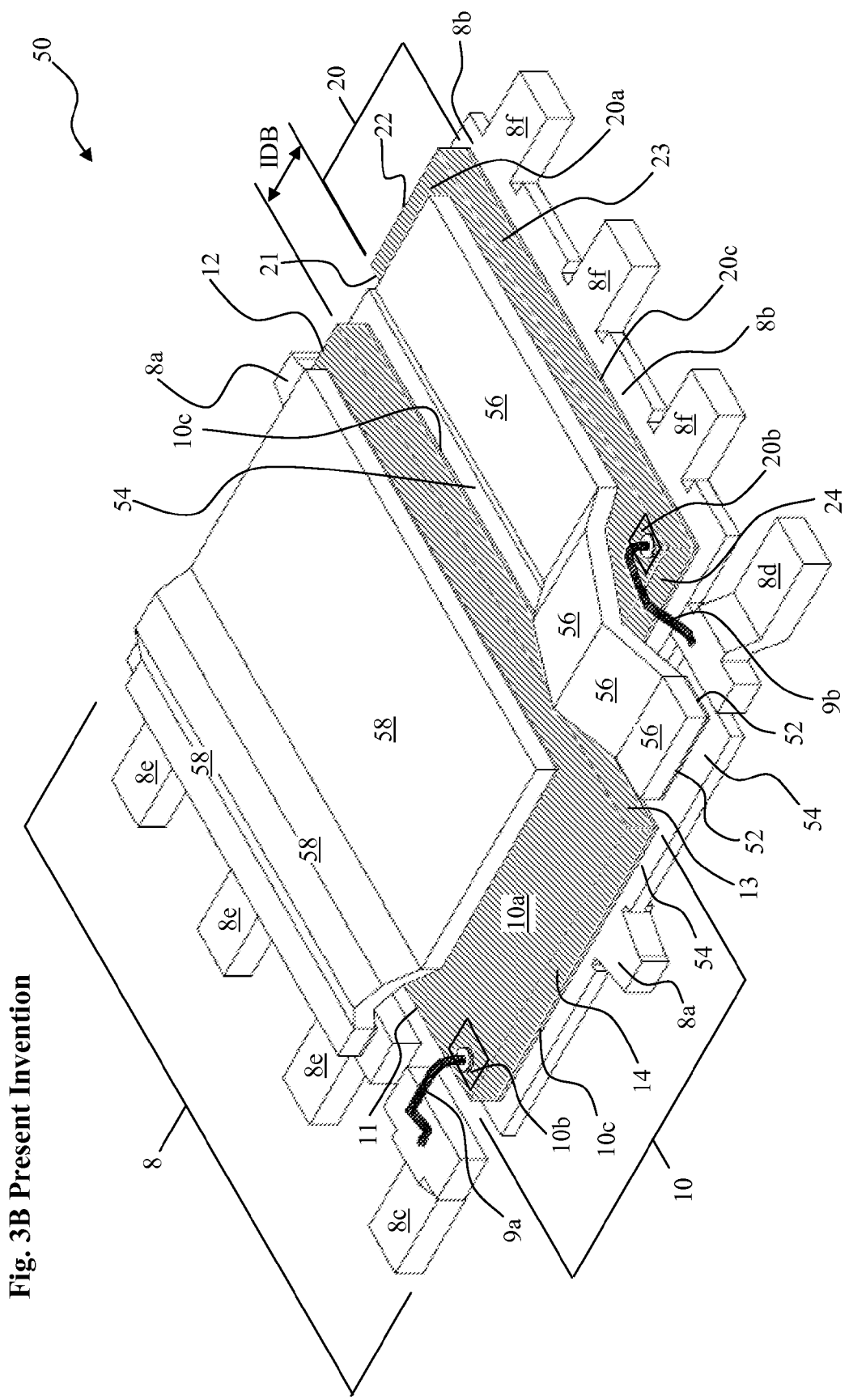
Fig. 3B Present Invention

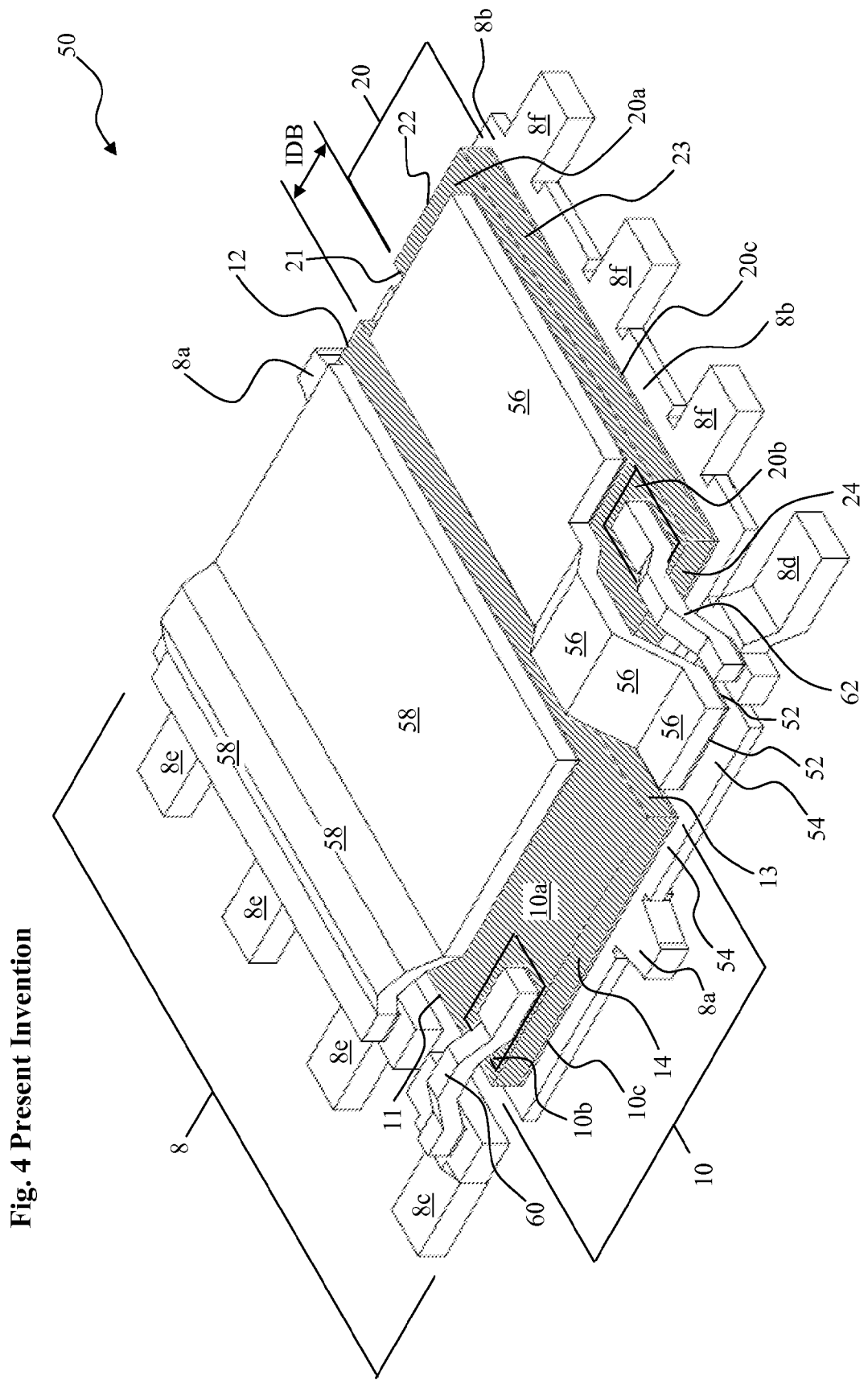
Fig. 4 Present Invention

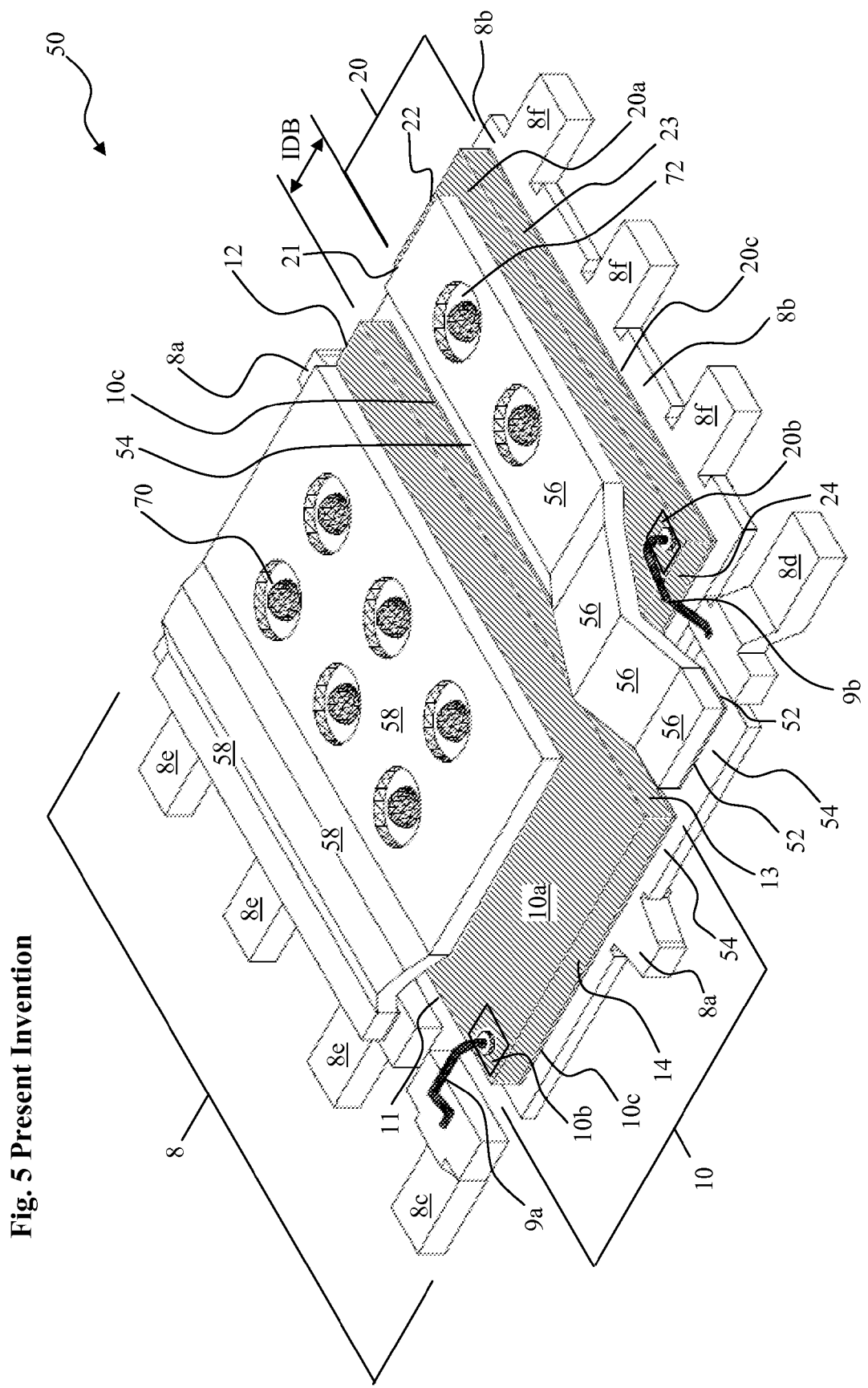
Fig. 5 Present Invention

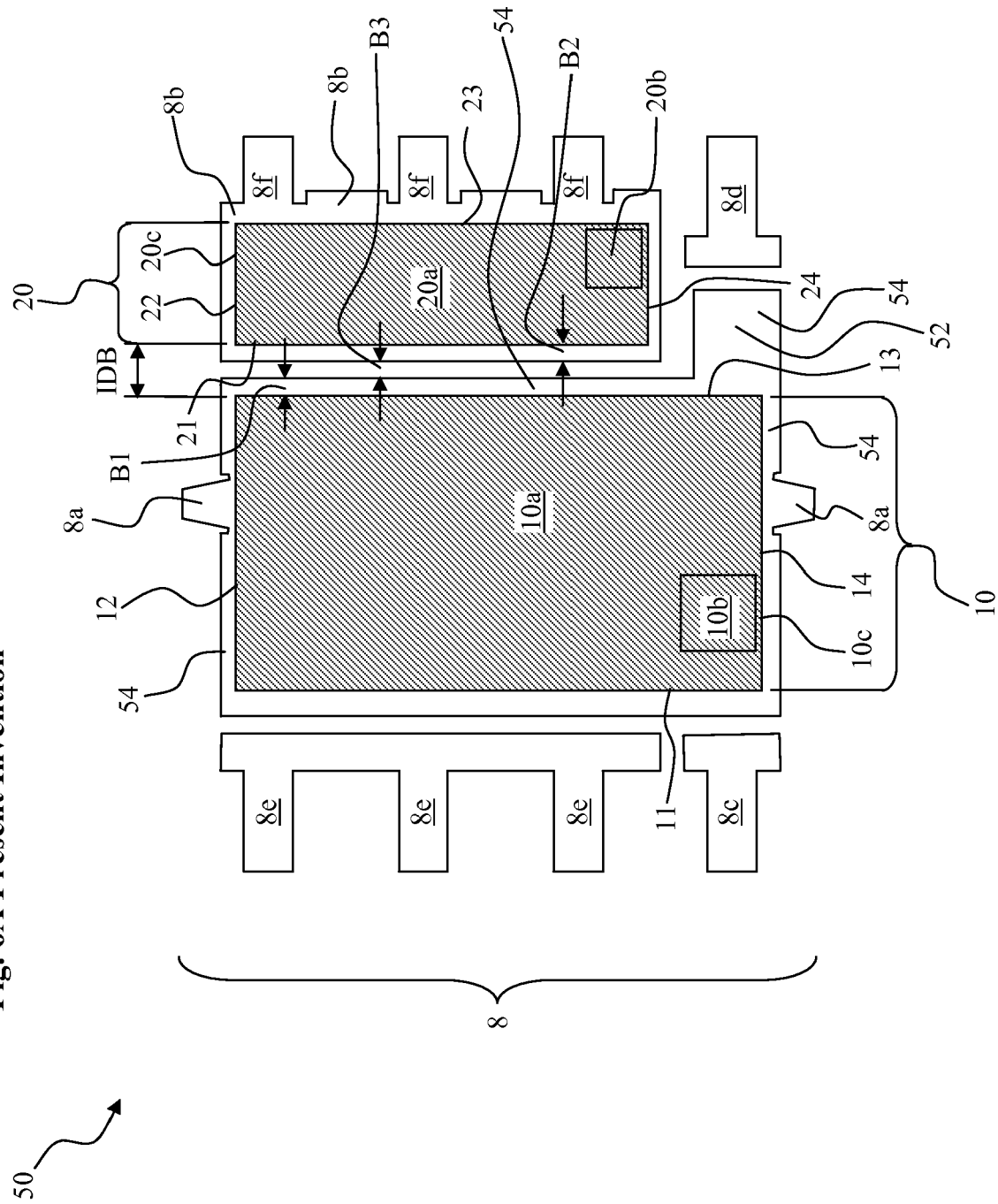
Fig. 6A Present Invention

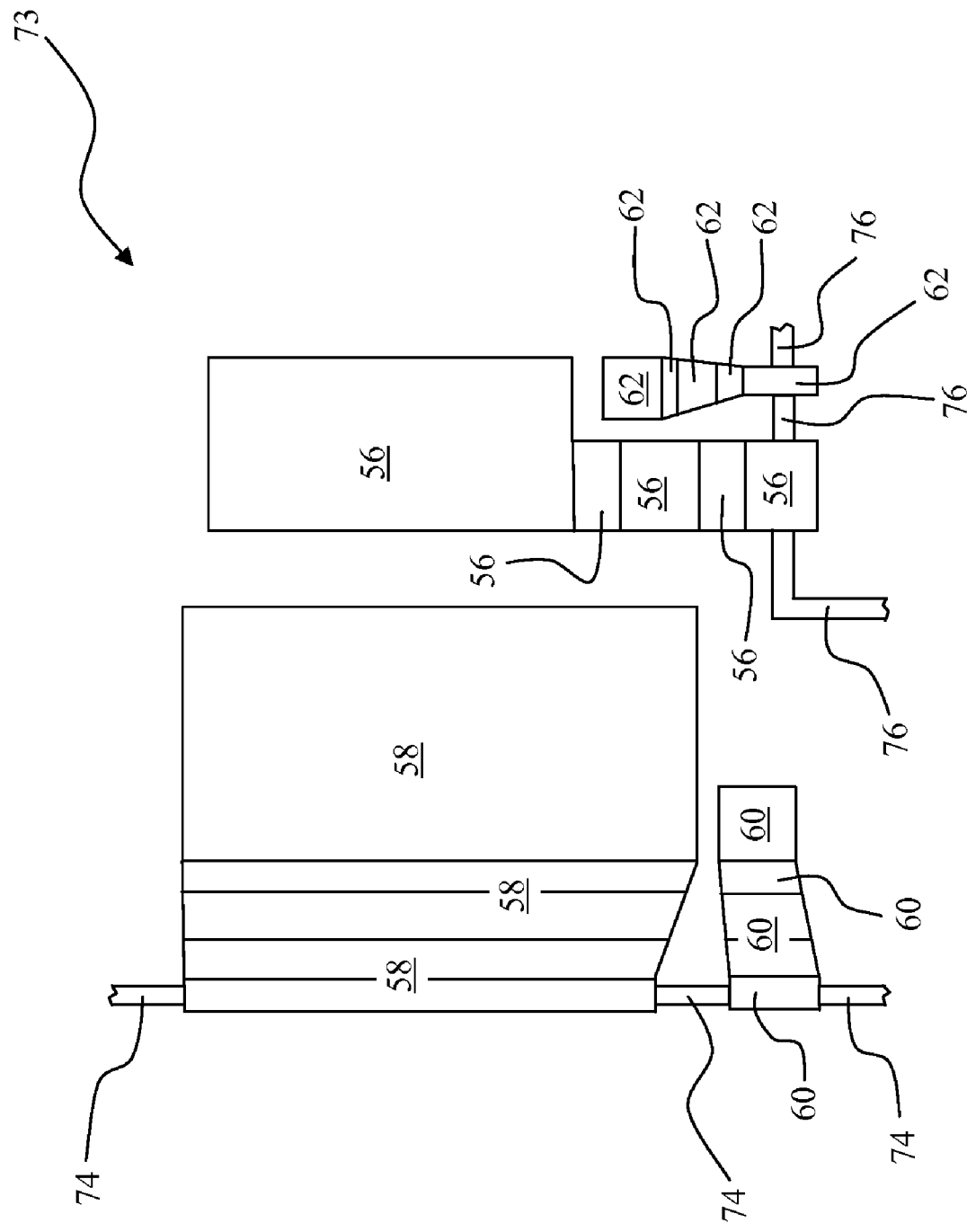
Fig. 6B Present Invention

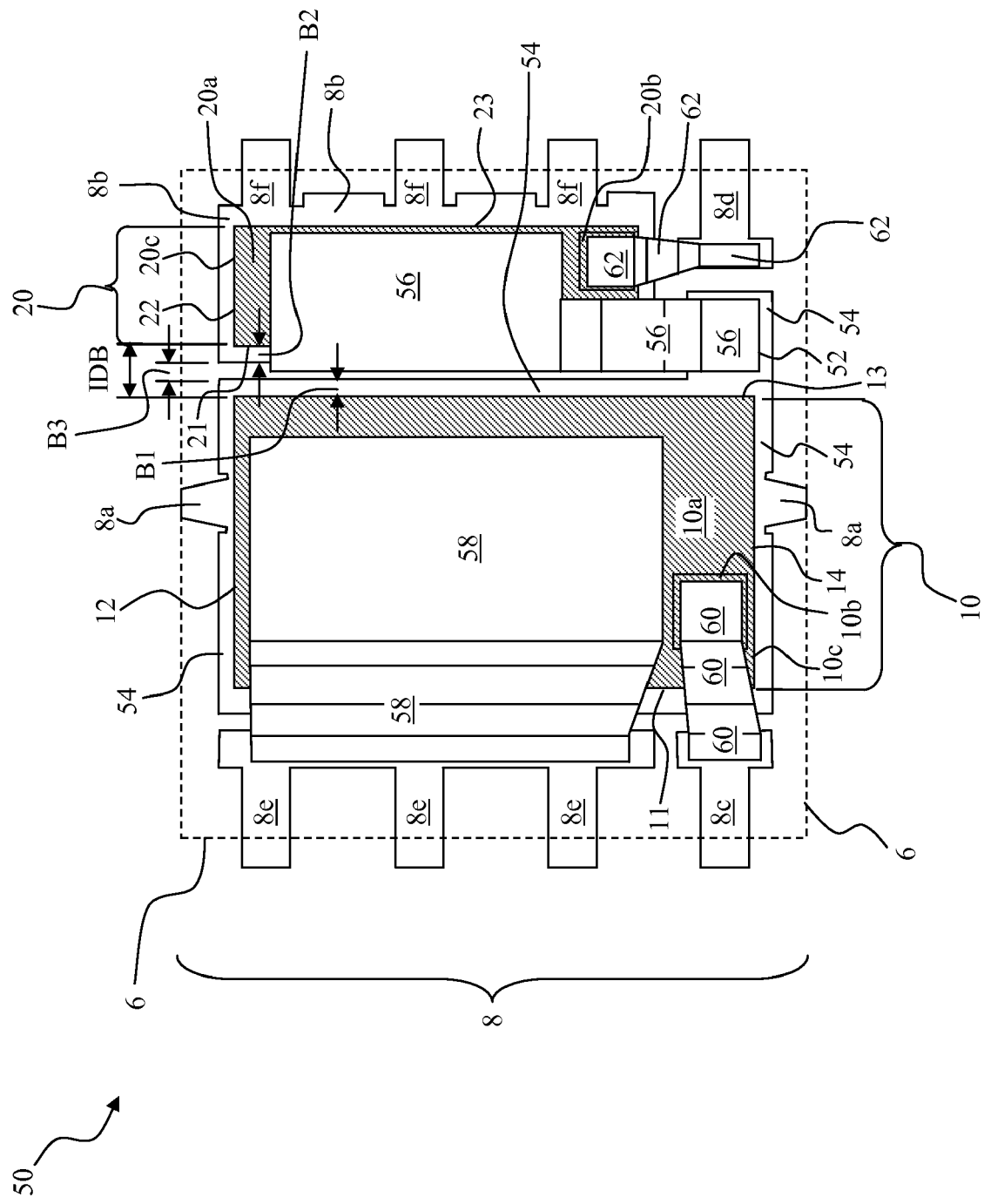
Fig. 6C Present Invention

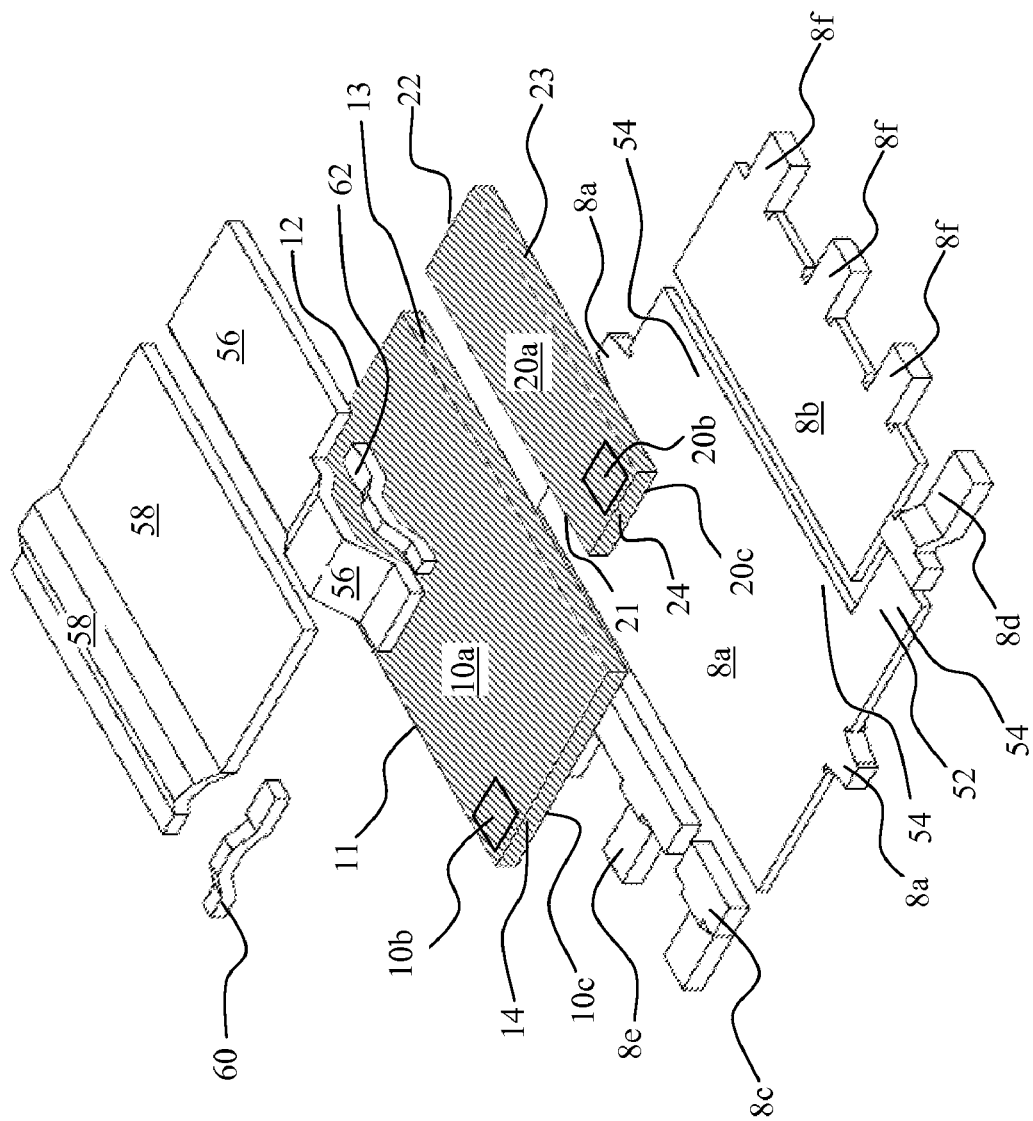
Fig. 6D Present Invention

COMPACT CO-PACKAGED SEMICONDUCTOR DIES WITH ELEVATION-ADAPTIVE INTERCONNECTION PLATES

CROSS REFERENCE TO RELATED APPLICATIONS

This application is related to the following commonly assigned patent applications:

"Semiconductor package having a bridged plate interconnection" by Lei Shi et al, U.S. application Ser. No. 11/906,136, publication # US20080087992, hereafter referred to as U.S. application Ser. No. 11/906,136

"Semiconductor Package Having Dimpled Plate Interconnections" by Ming Sun et al, U.S. application Ser. No. 11/799,467, hereafter referred to as U.S. application Ser. No. 11/799,467 whose content is incorporated herein by reference for any and all purposes.

FIELD OF INVENTION

This invention relates generally to the field of electronic system packaging. More specifically, the present invention is directed to the physical level packaging of semiconductor dies.

BACKGROUND OF THE INVENTION

Owing to their high integration density, extremely low quiescent leakage current and ever improving power handling capacity, power MOSFETs continue their popular adoption in power electronics such as switching power supplies and converters. One of the most important attributes of power MOSFETs is their packaged size that is continuously driven smaller by the consumer, especially so in portable electronic devices.

SUMMARY OF THE INVENTION

A semiconductor package is disclosed. It has:

A circuit substrate.

Two semiconductor dies whose bottom surfaces are electrically bonded atop the circuit substrate, in which:

die one is bordered by first die one longitudinal edge, second die one longitudinal edge, first die one transverse edge and second die one transverse edge; die two is bordered by first die two longitudinal edge, second die two longitudinal edge, first die two transverse edge and second die two transverse edge; die one and die two are located next to but separated from each other along their respective second die one longitudinal edge and first die two longitudinal edge with an inter-die distance.

An elevation-adaptive electrical connection for connecting a top metalized contact atop the surface of die two to the bottom surface of die one while accommodating for elevation difference between the surfaces. The elevation-adaptive electrical connection includes:

a) A circuit route, that is part of the circuit substrate, for electrically routing the bottom surface of die one to an exposed intermediate contact area atop the circuit substrate. The circuit route further includes an L-shaped route extending transversely from the second die one longitudinal edge near the second die one transverse edge and placing the intermediate contact area next to the second die two transverse edge.

b) An interconnection plate connecting the top metalized contact area of die two with the intermediate contact area while being three dimensionally formed to accommodate for elevation difference between the contact areas.

As a result, the semiconductor package reduces the inter-die distance from an otherwise straight transverse circuit routing between the second die one longitudinal edge and the first die two longitudinal edge.

As a refined embodiment, the interconnection plate further includes a bridge portion, valley portions disposed on either side of the bridge portion, plane portions disposed on either side of the valley portions and the bridge portion and a connection portion depending from one of the plane portions.

As a refined embodiment, the interconnection plate further includes dimples for contact with the top metalized contact area of die two.

As another refined embodiment, at least one of die one and die two further includes at least an additional top metalized contact and, correspondingly, the semiconductor package further comprises an additional interconnection plate connecting the additional top metalized contact with the circuit substrate while being three dimensionally formed to accommodate for an involved elevation difference.

As another refined embodiment, the additional interconnection plate further includes a bridge portion, valley portions disposed on either side of the bridge portion, plane portions disposed on either side of the valley portions and the bridge portion and a connection portion depending from one of the plane portions. The bridge portion can be exposed through the molding compound of the semiconductor package to facilitate heat dissipation.

In one embodiment, the circuit substrate is a leadframe having a die pad one and a die pad two for respectively seating and bonding die one and die two. Correspondingly, the L-shaped route is an extension of die pad one and a top metalized contact atop the surface of die one is electrically connected to leads of the leadframe by an interconnection plate.

As another refinement, the semiconductor package can be mostly encapsulated in a molding compound with a top surface of the interconnection plate exposed through the molding compound to facilitate heat dissipation.

In another embodiment, the circuit substrate is an insulating substrate having a conductive surface area one and a conductive surface area two for respectively seating and bonding die one and die two. Correspondingly, the L-shaped route is a conductive circuit trace extended from the conductive surface area one.

In a more specific embodiment, both die one and die two are MOSFET devices with their bottom surfaces being their respective drain contacts, their top surfaces containing their respective metalized source contacts plus metalized gate contacts and the elevation-adaptive electrical connection connects the metalized source contact of die two to the drain contact of die one without using a flip-chip process. The MOSFET gates can be connected to the circuit substrate by either bonding wires or interconnection plates.

A method is disclosed for efficiently connecting multiple, separate and three dimensionally formed interconnection plates, each with a pre-determined geometry, onto a matching circuit substrate having a pair of bonded semiconductor dies atop. The method includes:

a) Making a multi-plate carrier frame having the multiple interconnection plates integrally held on it with numerous integrated interim holding members.
b) Separating the individual interconnection plates from the multi-plate carrier frame by breaking the interim holding members.
c) Attaching each interconnection plate onto the matching circuit substrate.

Where attaching each interconnection plate further includes connecting one of the interconnection plates from the top of one semiconductor die to an intermediate contact area and the intermediate contact area includes an L-shaped circuit route that extends from below the other semiconductor die.

As a refinement, making the multi-plate carrier frame further includes three dimensionally forming the interconnection plates on it with a forming tool.

As another refinement, separating the multi-plate carrier frame further involves punching it apart with a punching tool.

As another refinement, separating the individual interconnection plates from the multi-plate carrier frame further involves separating the individual interconnection plates from each other. This can be done simultaneously with separating the individual interconnection plates from the multi-plate carrier frame, or afterwards.

As another refinement, attaching each interconnection plate onto the matching circuit substrate is done simultaneously with multiple heads to hold the plates.

As another refinement, the method further includes a step of encapsulating at least a portion of the circuit substrate, the plurality of semiconductor dies and the interconnection plate.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 3A illustrates the present invention co-packaged semiconductor dies on a leadframe corresponding to the LS and HS power MOSFETs interconnected with elevation-adaptive interconnection plates;

FIG. 3B is a perspective view of FIG. 3A;

FIG. 4 illustrates the present invention co-packaged semiconductor dies on a leadframe corresponding to the LS and HS power MOSFETs with all package interconnections implemented using elevation-adaptive interconnection plates;

FIG. 5 is the same as FIG. 3B except that each of the elevation-adaptive interconnection plates further incorporates dimples for contact with their respective top metalized contacts;

FIG. 6A is the same as FIG. 3A except that the elevation-adaptive interconnection plates and bond wires are removed to more clearly reveal an L-shaped route and an intermediate contact area of the leadframe;

FIG. 6B illustrates a multi-plate carrier frame for efficiently connecting multiple, separate and three dimensionally formed elevation-adaptive interconnection plates onto a matching circuit substrate having bonded semiconductor dies atop;

FIG. 6C is a top view illustrating the connected multiple elevation-adaptive interconnection plates using the multi-plate carrier frame of FIG. 6B;

FIG. 6D is a perspective view of FIG. 6C except that the semiconductor dies and the elevation-adaptive interconnection plates are purposely floated upwards to further reveal the leadframe, the semiconductor dies and the elevation-adaptive interconnection plates.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1:
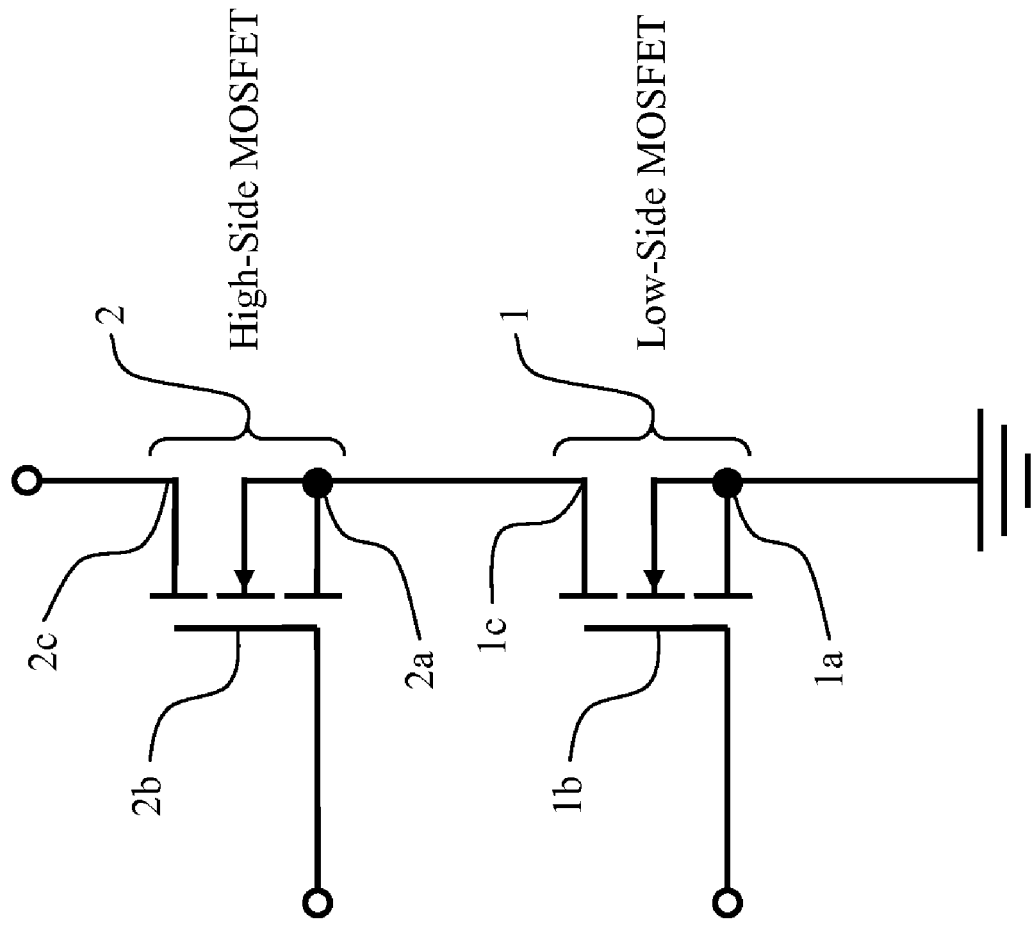
FIG. 1 is a circuit schematic showing a pair of connected low-side (LS) and high-side (HS) power MOSFETs.

FIG. 1 is a circuit schematic showing a pair of connected low-side (LS) MOSFET 1 and high-side (HS) power MOSFET 2. The low-side (LS) source 1a is grounded. While not specifically illustrated, the high-side (HS) drain 2c is usually connected directly or indirectly to a positive power supply. Notice that the low-side (LS) drain 1c is connected to the high-side (HS) source 2a. To those skilled in the art, the low-side (LS) gate 1b and the high-side (HS) gate 2b are usually alternatively driven high to make the low-side (LS) MOSFET 1 and the high-side (HS) MOSFET 2 alternatively conductive and such a power circuit topology can be commonly found in numerous power converters and regulators.

Figure 2:
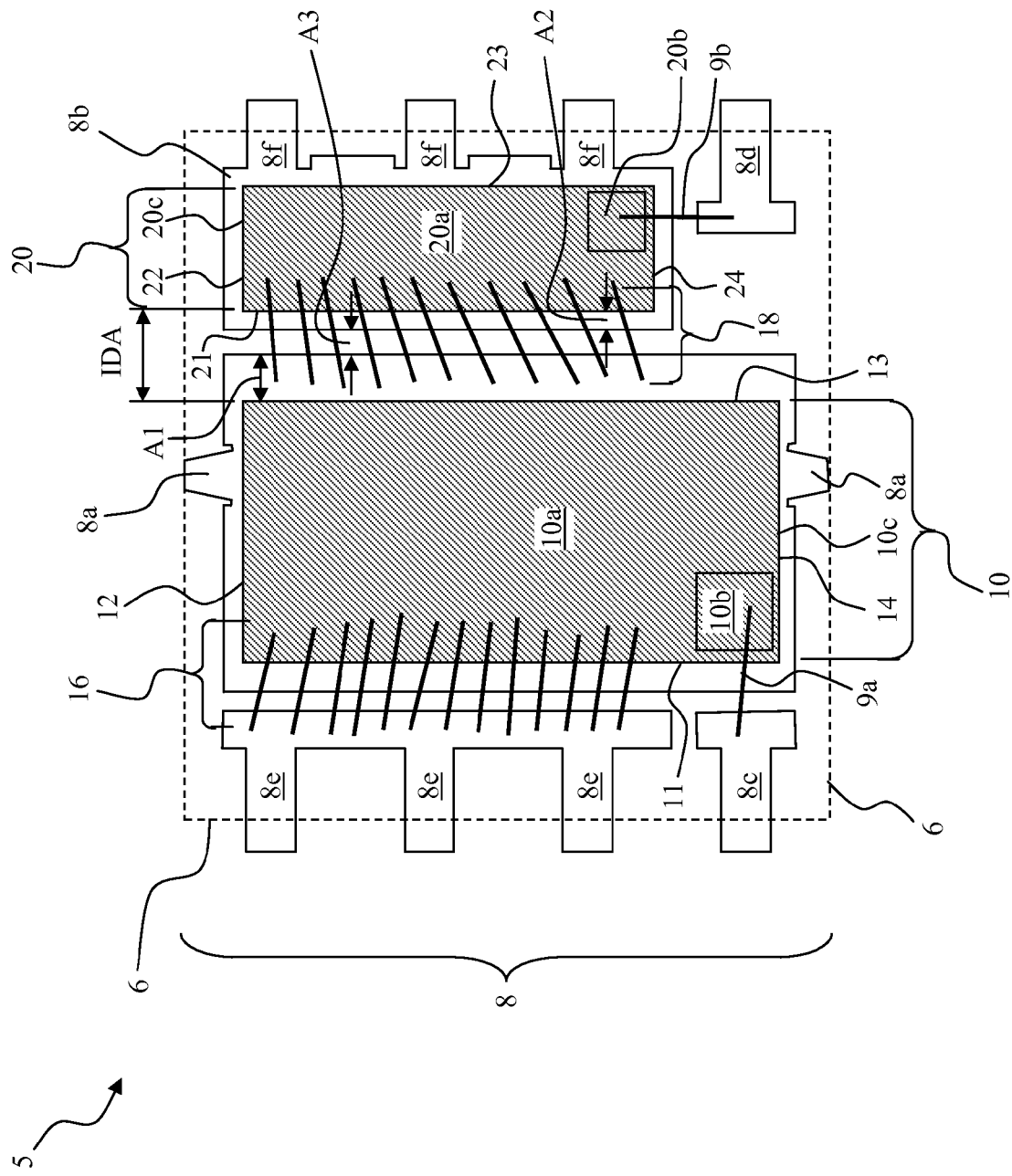
FIG. 2 illustrates a prior art co-packaged semiconductor dies on a leadframe corresponding to the LS and HS power MOSFETs interconnected with bond wires.

From simple and low cost fabrication of the LS MOSFET 1 and the HS MOSFET 2, their correspondingly fabricated semiconductor dies usually have the device drain contact located on their bottom substrate surface, their source contact occupy bulk of their top surface while their gate contact occupy a small fraction of their top surface. Thus, absent a more complicated and expensive flip chip process, FIG. 2 illustrates a top view of a prior art semiconductor package 5 for packaging the LS MOSFET 1 and the HS MOSFET 2, now illustrated respectively as low-side (LS) die 10 and high-side (HS) die 20, atop a leadframe 8. Thus, LS die 10 has an LS die top metalized source contact 10a, an LS die top metalized gate contact 10b and an LS die bottom metalized drain contact 10c. Similarly, HS die 20 has a HS die top metalized source contact 20a, a HS die top metalized gate contact 20b and a HS die bottom metalized drain contact 20c. Notice that the LS die 10 is bordered by first LS die longitudinal edge 11, second LS die longitudinal edge 13, first LS die transverse edge 12 and second LS die transverse edge 14. Similarly the HS die 20 is bordered by first HS die longitudinal edge 21, second HS die longitudinal edge 23, first HS die transverse edge 22 and second HS die transverse edge 24. The leadframe 8 has numerous physically and electrically separated leadframe segments 8a, 8b (further including 8f), 8c, 8d, and 8e. The leadframe segments 8a-8e may be, but not necessarily, coplanar. The bottom surfaces, i.e. drain contacts, of LS die 10 and HS die 20 are respectively bonded electrically to the leadframe segment 8a and leadframe segment 8b. The LS die top metalized source contact 10a is connected to leadframe segment 8e with transverse LS terminal bond wires 16 while the LS die top metalized gate contact 10b is connected to leadframe segment 8c with a transverse bond wire 9a. The HS die top metalized gate contact 20b is connected to leadframe segment 8d with a longitudinal bond wire 9b. As the LS die bottom metalized drain contact 10c is now electrically bonded to the top surface of leadframe segment 8a, transverse LS-HS interconnection bond wires 18, bridging the top surface of leadframe segment 8a to the HS die top metalized source contact 20a, now accomplishes the required electrical connection between the LS die bottom metalized drain contact 10c and the HS die top metalized source contact 20a. Finally, an encapsulant 6 can be applied to a portion or all of the packaged LS die 10 and HS die 20 while exposing only those peripheral parts of the leadframe segments 8a-8f for external connection.

Turning now to an important packaging related parameter called inter-die distance IDA that is the spacing between the second LS die longitudinal edge 13 and the first HS die longitudinal edge 21. The inter-die distance IDA limits the minimum achievable packaged size of the prior art semiconductor package 5 along its transverse direction. Alternatively, for a given package size, the inter-die distance IDA limits the die size, and thus increases the on-resistance $R_{dson}$ of the device. While the following are already fundamental parameters dictating a corresponding fundamental minimum value of the inter-die distance IDA:

Minimum transverse die-leadframe margin $A_1$ that is the transverse distance between the second LS die longitudinal edge 13 and its nearest longitudinal edge of the leadframe segment 8a Minimum transverse die-leadframe margin $A_2$ that is the transverse distance between the first HS die longitudinal edge 21 and its nearest longitudinal edge of the leadframe segment 8b Minimum transverse leadframe-leadframe clearance $A_3$ that is the transverse distance between the leadframe segment 8a and the leadframe segment 8b with:

$$IDA = A_1 + A_2 + A_3,$$

the implementation of the transverse LS-HS interconnection bond wires 18 causes the transverse die-leadframe margin $A_1$ and the transverse leadframe-leadframe clearance $A_3$ to be higher than their respective fundamental minimum values as the production equipment for wire bonding dictates a higher transverse die-leadframe margin $A_1$ for landing wire bonding tips and further dictates a larger transverse leadframe-leadframe clearance $A_3$ for accommodating minimum required bond wire loop spans.

To reduce the inter-die distance IDA so as to correspondingly reduce the packaged size of the prior art semiconductor package 5 along its transverse direction, FIG. 3A together with its perspective view of FIG. 3B illustrate the present invention semiconductor package 50 with an inter-die distance IDB. Instead of using the transverse LS-HS interconnection bond wires 18 of FIG. 2, an elevation-adaptive electrical connection is used for connecting the HS die top metalized source contact 20a to the LS die bottom metalized drain contact 10c while accommodating for elevation difference between the surfaces of 20a and 10c. More specifically, the elevation-adaptive electrical connection includes:

An L-shaped leadframe route 54 that is part of the leadframe segment 8a, for electrically routing the LS die bottom metalized drain contact 10c to an exposed intermediate contact area 52 atop the leadframe segment 8a. The L-shaped leadframe route 54 extends transversely from the second LS die longitudinal edge 13 near the second LS die transverse edge 14 and places the intermediate contact area 52 next to the second HS die transverse edge 24.

An elevation-adaptive interconnection plate 56 connecting the HS die top metalized source contact 20a with the intermediate contact area 52. The elevation-adaptive interconnection plate 56 is further three dimensionally formed to accommodate for elevation difference between the surfaces of 20a and 52.

While the following are still fundamental parameters dictating a corresponding fundamental minimum value of the inter-die distance IDB:

Minimum transverse die-leadframe margin $B_1$ that is the transverse distance between the second LS die longitudinal edge 13 and its nearest longitudinal edge of the leadframe segment 8a Minimum transverse die-leadframe margin $B_2$ that is the transverse distance between the first HS die longitudinal edge 21 and its nearest longitudinal edge of the leadframe segment 8b Minimum transverse leadframe-leadframe clearance $B_3$ that is the transverse distance between the leadframe segment 8a and the leadframe segment 8b with:

$$IDB = B_1 + B_2 + B_3,$$

the implementation of the L-shaped leadframe route 54 together with the elevation-adaptive interconnection plate 56 no longer force the transverse die-leadframe margin $B_1$ and the transverse leadframe-leadframe clearance $B_3$ to become higher than their respective fundamental minimum values. As a result the present invention effectively reduces the inter-die distance as follows:

$$IDB < IDA$$

The decreased inter-die distance IDB enables the package footprint to decease in size. Alternatively, for the same package size, the LS and HS dies 10 and 20 can be made larger, thus reducing the on resistance, $R_{dson}$.

It is further remarked that, by invoking and placing the intermediate contact area 52 next to the second HS die transverse edge 24, the L-shaped leadframe route 54 of the leadframe segment 8a acts as the most important contributor to the present invention in reducing the inter-die distance and correspondingly the semiconductor package foot print from an otherwise straight forward transverse circuit routing between the second LS die longitudinal edge 13 and the first HS die longitudinal edge 21. Likewise, while the transverse LS terminal bond wires 16 of the prior art semiconductor package 5 are also shown here replaced with an elevation-adaptive interconnection plate 58 in the present invention semiconductor package 50 with accompanying advantages of reduced parasitic impedance, this replacement is not of primary importance in the reduction of inter-die distance. The use of interconnection plate 56 rather than the bond wires 18 (of FIG. 2) has the additional advantage of reducing the inductance between the high side die 20 and the low side die 10.

Figure 7:
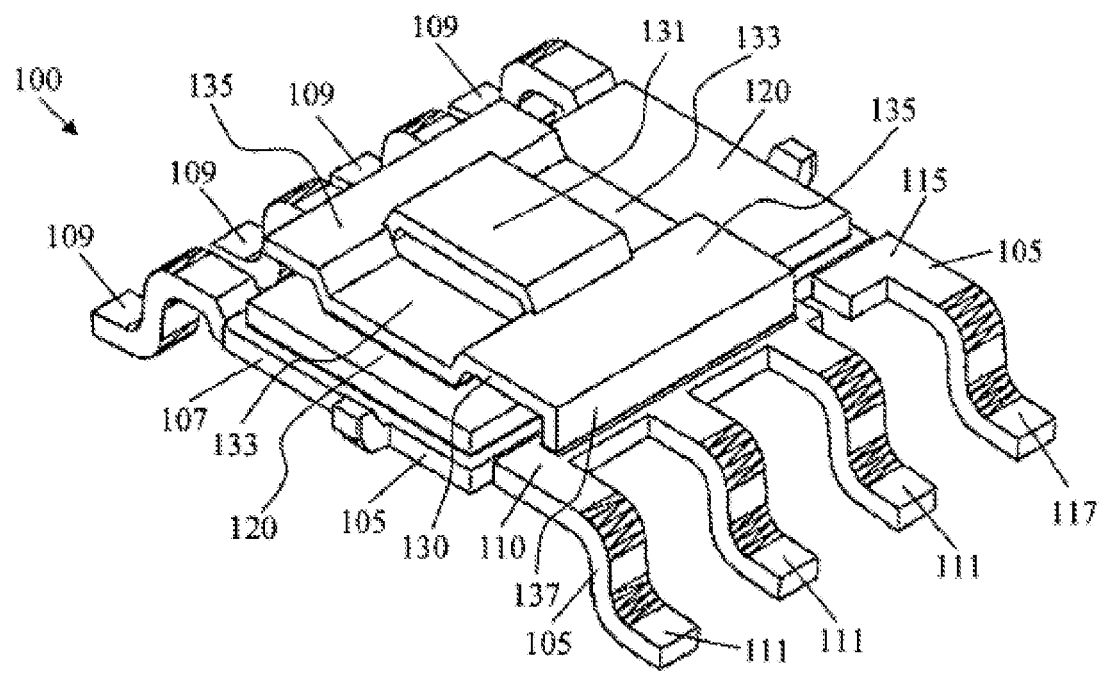
FIG. 7 and FIG. 8 are excerpted figures from U.S. application Ser. No. 11/906,136 illustrating various features of its disclosed bridged plate interconnection.
Figure 8:
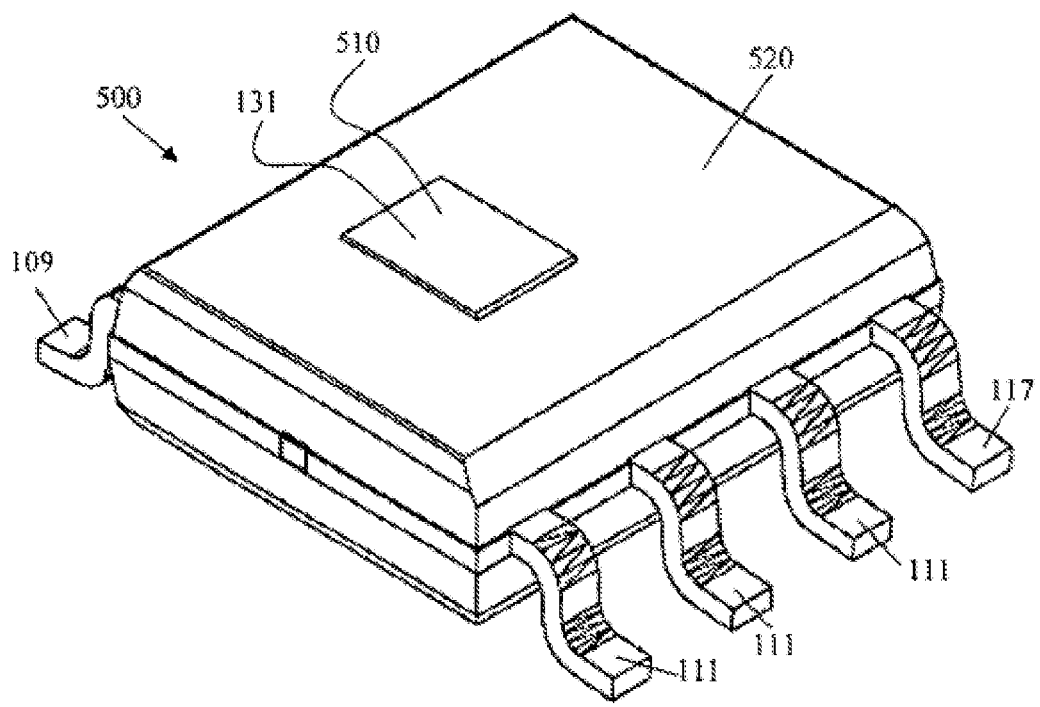

FIG. 4 illustrates another embodiment of the present invention semiconductor package 50 wherein, in addition to the elevation-adaptive interconnection plates 56 and 58, the rest of package interconnections are implemented with elevation-adaptive interconnection plates as well. Specifically, an elevation-adaptive interconnection plate 60 is used for connecting the LS die top metalized gate contact 10b to the leadframe segment 8c and an elevation-adaptive interconnection plate 62 is used for connecting the HS die top metalized gate contact 20b to the leadframe segment 8d. To those skilled in the art, by now it should become clear that either or both of the elevation-adaptive interconnection plate 56 and elevation-adaptive interconnection plate 58 can be further embodied to include a bridge portion, valley portions disposed on either side of the bridge portion, plane portions disposed on either side of the valley portions and the bridge portion and a connection portion depending from one of the plane portions, as further detailed in U.S. application Ser. No. 11/906,136. To further clarify this point graphically, FIG. 7 and FIG. 8 are respectively excerpted FIG. 1 and FIG. 5 from U.S. application Ser. No. 11/906,136 illustrating various features of its disclosed bridged plate interconnection. FIG. 1 and FIG. 5 from U.S. application Ser. No. 11/906,136 are respectively renamed as FIG. 7 and FIG. 8 of the present invention application to avoid any naming confusion with the rest of its other figures. Thus, a bridged source plate 130 of a semiconductor package generally designated 100 of FIG. 7 can be seen to include a bridge portion 131, valley portions 133, plane portions 135 and a connection portion 137. The bridge portion 131 of FIG. 7 remains exposed through an encapsulant 520 in the semiconductor package generally designated 500 of FIG. 8. Furthermore, the present invention semiconductor package 50 can be mostly encapsulated in an encapsulant 6 except for the bridge portion of the interconnection plates being exposed through the encapsulant 6 to facilitate heat dissipation. Similarly, as illustrated in FIG. 5, either or both of the elevation-adaptive interconnection plates 56 and 58 can be further embodied to include contact dimples 70 and 72 for contact respectively with the LS die top metalized source contact 10a and the HS die top metalized source contact 20a, as further detailed in U.S. application Ser. No. 11/799,467.

By now it should also become clear to those skilled in the art that, in general, the leadframe 8 could be substituted with numerous other types of circuit substrates within the scope of the present invention semiconductor package. For example, a printed circuit board (PCB) could be used in lieu of the leadframe 8. The PCB can then include an insulating substrate, a conductive surface area one and a conductive surface area two for respectively seating and bonding LS die 10 and HS die 20. Correspondingly, the L-shaped leadframe route 54 can be made of a conductive circuit trace extending from the conductive surface area one.

FIG. 6B through FIG. 6D illustrate a multi-plate carrier frame 73 and associated method for efficiently connecting the multiple, separate and three dimensionally formed elevation-adaptive interconnection plates 56, 58, 60 and 62 onto a matching circuit substrate having bonded semiconductor dies atop. In this case, the matching circuit substrate is the leadframe 8 and the bonded semiconductor dies are LS die 10 and HS die 20.

As illustrated in FIG. 6B, a multi-plate carrier frame 73 is made having the multiple interconnection plates 56, 58, 60 and 62 integrally held on it with numerous integrated interim tie bars 74 and 76 for easy handling. As a refinement, the interconnection plates can be further tied to one another with additional tie bars. Making the multi-plate carrier frame 73 further involves three dimensionally forming the interconnection plates on it with a forming tool. Next, the individual interconnection plates 56, 58, 60 and 62 are separated from the multi-plate carrier frame 73 by cutting the interim tie bars 74 and 76. The separation can be effected by punching it apart with a punching tool. Afterwards, each interconnection plate can be picked up with a vacuum tool, positioned and attached onto the matching circuit substrate. As process refinements, the interconnection plates can be individually or simultaneously attached onto the matching circuit substrate. As another process refinement, the individual interconnection plates of each circuit substrate can be left attached together while separating the multi-plate carrier frame. Then, after attaching each interconnection plate onto the matching circuit substrate, the individual interconnection plates of each circuit substrate can be separated from each other. Finally, the matching circuit substrate together with its packaged semiconductor dies and interconnection plates can be encapsulated with a molding compound.

Within the context of the present invention, attaching each interconnection plate further involves connecting one of the interconnection plates from the top of one semiconductor die to an intermediate contact area and the intermediate contact area includes an L-shaped circuit route that extends from below the other semiconductor die. Thus, FIG. 6C is a top view illustrating the now connected multiple elevation-adaptive interconnection plates 56, 58, 60 and 62 using the multi-plate carrier frame 73 of FIG. 6B. FIG. 6D is a perspective view of FIG. 6C except that the semiconductor dies 10, 20 and the elevation-adaptive interconnection plates 56, 58, 60 and 62 are purposely floated upwards to further reveal the leadframe 8, the semiconductor dies, the L-shaped leadframe route 54 and the elevation-adaptive interconnection plates.

By now it should become clear to those skilled in the art that the numerous embodiments just described can be readily modified to suit other specific applications as well. While the description above contains many specificities, these specificities should not be constructed as accordingly limiting the scope of the present invention but as merely providing illustrations of numerous presently preferred embodiments of this invention. For example, the present invention semiconductor package system expects to be applicable to the packaging of a wide variety of semiconductor dies other than just MOSFET dies as disclosed herein.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A semiconductor package comprising:
   a circuit substrate;
   a plurality of semiconductor dies whose bottom surfaces are electrically bonded atop the circuit substrate, said semiconductor dies further comprise:
   a die one bordered by first die one longitudinal edge and second die one longitudinal edge plus first die one transverse edge and second die one transverse edge; and a die two bordered by first die two longitudinal edge and second die two longitudinal edge plus first die two transverse edge and second die two transverse edge; wherein said die one and die two are located next to but separated, with an inter-die distance, from each other along their respective second die one longitudinal edge and first die two longitudinal edge; and an elevation-adaptive electrical connection for connecting a top metalized contact atop the surface of die two to the bottom surface of die one while accommodating for elevation difference between the surfaces, said elevation-adaptive electrical connection further comprises:

a) an L-shaped circuit route, being part of and coplanar with the circuit substrate, extending transversely from the second die one longitudinal edge near the second die one transverse edge and terminating with an exposed intermediate contact area atop the circuit substrate and next to the second die two transverse edge for electrically routing the bottom surface of die one to the exposed intermediate contact area; and b) an interconnection plate connecting the top metalized contact area of die two with said exposed intermediate contact area while being three dimensionally formed to accommodate for elevation difference between the contact areas whereby the presence of said L-shaped circuit route and exposed intermediate contact area allow reduction of the inter-die distance from an otherwise straight transverse circuit routing between the second die one longitudinal edge and the first die two longitudinal edge.

2. The semiconductor package of claim 1 wherein said interconnection plate further comprises a bridge portion, valley portions disposed on either side of the bridge portion, plane portions disposed on either side of the valley portions and the bridge portion and a connection portion depending from one of the plane portions.

3. The semiconductor package of claim 1 wherein said interconnection plate further comprises dimples positioned thereon for contact with the top metalized contact.

4. The semiconductor package of claim 1 wherein at least one of said die one and die two further comprises at least an additional top metalized contact and, correspondingly, the semiconductor package further comprises an additional interconnection plate connecting the additional top metalized contact with the circuit substrate while being three dimensionally formed to accommodate for elevation difference there between.

5. The semiconductor package of claim 1 wherein said circuit substrate is a leadframe further comprising a die pad one and a die pad two for respectively seating and bonding said die one and said die two and, correspondingly, said L-shaped route is an extension of said die pad one.

6. The semiconductor package of claim 5 wherein a top metalized contact atop the surface of die one is electrically connected to leads of the leadframe by an interconnection plate.

7. The semiconductor package of claim 6 further comprising a molding compound wherein the semiconductor package is mostly encapsulated in the molding compound and a top surface of the interconnection plate atop die one is exposed through the molding compound to facilitate heat dissipation.

8. The semiconductor package of claim 7 wherein the interconnection plate atop die one further comprises a bridge portion, valley portions disposed on either side of the bridge portion, plane portions disposed on either side of the valley portions and the bridge portion and a connection portion depending from one of the plane portions, wherein the exposed top surface of the interconnection plate is part of its bridge portion.

9. The semiconductor package of claim 1 wherein said circuit substrate is a printed circuit board (PCB) further comprising an insulating substrate, a conductive surface area one and a conductive surface area two for respectively seating and bonding said die one and said die two and, correspondingly, said L-shaped route is a conductive circuit trace extended from the conductive surface area one.

10. The semiconductor package of claim 1 wherein both die one and die two are MOSFET devices with their bottom surfaces being their respective drain contacts, their top surfaces containing their respective metalized source contacts plus metalized gate contacts and the elevation-adaptive electrical connection connects the metalized source contact of die two to the drain contact of die one without using a flip-chip process.

11. The semiconductor package of claim 10 wherein said die one is a low side MOSFET device and said die two is a high side MOSFET device.

12. The semiconductor package of claim 10 wherein the MOSFETs gates are connected to the circuit substrate by bonding wires.

13. The semiconductor package of claim 10 wherein the MOSFETs gates are connected to the circuit substrate by interconnection plates.

14. The semiconductor package of claim 1 wherein a top metalized contact atop the surface of die one is connected to the circuit substrate by an interconnection plate.

15. The semiconductor package of claim 1 further comprising a molding compound covering at least a portion of the circuit substrate, the plurality of semiconductor dies and the elevation-adaptive electrical connection.

16. A method of packaging two semiconductor dies, the two semiconductor dies comprising:

a die one bordered by first die one longitudinal edge and second die one longitudinal edge plus first die one transverse edge and second die one transverse edge; and a die two bordered by first die two longitudinal edge and second die two longitudinal edge plus first die two transverse edge and second die two transverse edge; wherein said die one and die two are to be located next to but separated, with an inter-die distance, from each other along their respective second die one longitudinal edge and first die two longitudinal edge; furthermore a top metalized contact atop the surface of die two is to be connected to the bottom surface of die one, the method comprising:

providing a circuit substrate and bonding the bottom surfaces of the semiconductor dies thereon;

connecting the top metalized contact atop the surface of die two to the bottom surface of die one while accommodating for elevation difference between the surfaces with an elevation-adaptive electrical connection comprising:

a) an L-shaped circuit route, being part of and coplanar with the circuit substrate, extending transversely from the second die one longitudinal edge near the second die one transverse edge and terminating with an exposed intermediate contact area atop the circuit substrate and next to the second die two transverse edge for electrically routing the bottom surface of die one to the exposed intermediate contact area; and b) an interconnection plate connecting the top metalized contact area of die two with said exposed intermediate contact area while being three dimensionally formed to accommodate for elevation difference between the contact areas
whereby the presence of said L-shaped circuit route and exposed intermediate contact area allow reduction of the inter-die distance from an otherwise straight transverse circuit routing between the second die one longitudinal edge and the first die two longitudinal edge.

* * * * *